United States Patent [19]

Bonora

[11] 4,132,037
[45] Jan. 2, 1979

[54] APPARATUS FOR POLISHING SEMICONDUCTOR WAFERS

[75] Inventor: Anthony C. Bonora, Atherton, Calif.

[73] Assignee: Siltec Corporation, Menlo Park, Calif.

[21] Appl. No.: 772,749

[22] Filed: Feb. 28, 1977

[51] Int. Cl.² .............................................. B24B 37/04
[52] U.S. Cl. ................................ 51/131 C; 51/216 LP
[58] Field of Search ............... 51/131, 216 R, 216 LP, 51/216 T, 237, 283; 269/321 WE

[56] References Cited
U.S. PATENT DOCUMENTS

| 3,449,870 | 6/1969 | Jensen | 51/216 LP |
| 3,453,783 | 7/1969 | Queen | 51/216 LP |
| 3,841,031 | 10/1974 | Walsh | 51/283 |

Primary Examiner—N. P. Godici
Attorney, Agent, or Firm—C. Michael Zimmerman

[57] ABSTRACT

Semiconductor wafer polishing apparatus is described having a sheet of wafer mounting material on its carrier to rigidly hold a plurality of wafers to be polished during the polishing operation. The mounting material includes a lamina of a polymeric material which exhibits surface wetting characteristics to aid in adhering the back side of wafers thereto and a lamina of a volume compressible material which absorbs without wafer deformation any asperities on the back side of such wafers.

13 Claims, 3 Drawing Figures

APPARATUS FOR POLISHING SEMICONDUCTOR WAFERS

BACKGROUND OF THE INVENTION

The present invention relates to semiconductor materials and, more particularly, to polishing the surface of a semiconductor wafer of a silicon or other material from which solid state electronic devices are fabricated.

The basic substrate material for the solid state electronics industry is the silicon wafer, i.e., a flat disc of single crystalline silicon having a thickness of about 0.015 inches (0.38 mm). The wafers are generally produced by first growing an elongated single crystal of the silicon or other semiconductor material, and then slicing the same into wafer form. One side surface of each wafer, which side surface is referred to herein as the front or front side surface, is then highly polished on apparatus designed specifically for such purpose. Such surface is required to be polished in order to form reliable semiconductor junctions with other materials which are applied in thin films thereto.

Generally, the polishing apparatus includes a backing plate or carrier to which unpolished wafers are adhered, with the wafer surfaces to be polished exposed to a polishing pad which engages the same with polishing pressure. The polishing pad and carrier are then typically both rotated at differential velocities to cause relative lateral motion between the polishing pad and such wafer front side surfaces. A colloidal silica slurry is generally provided at the polishing pad-wafer surface interface during the polishing operation to aid in the polishing.

The wafers are generally adhered to the carrier for the polishing operation by a thin wax or resin film. However, the quality level of finished wafer products required for some applications has increased to the point that wax adherence is no longer satisfactory in many instances. In this connection, when a wax or similar film is used to mount the wafers, any random variations in film thickness, dust particles or other contaminations in the wax film, or any asperities on the back surface of the wafer, i.e., that surface of the wafer which is adhered to the carrier, will cause the polishing operation to form irregularities on the wafer front surface. This results in the finished polished surface not having the required flatness. Moreover, the wax film is, in effect, a contaminant which must be removed (often in a relatively complicated manner) from the wafer after the polishing operation.

In order to avoid the disadvantages inherent in wax mounting, workers in the field have devised other, wax-free, methods of securing a wafer to a backing plate for the polishing operation. For example, templates made of MYLAR ® or a similar material having apertures which accept the wafers have been mounted on the carrier. Wafers are typically adhered within the template apertures by the surface tension of a water or the like film. A major shortcoming of this technique is that the wafers tend to slide around within the apertures (particularly at high polishing pressures), increasing the likelihood of wafer breakage and intermittently polishing the wafer back surface. Another approach that has been proposed is the use of vacuum suction to adhere the wafers to the backing plate. Difficulty has been experienced with this approach, however, in attempts to prevent the polishing slurry from being sucked beneath the wafers in those areas in which they only partially contact the carrier. Also, such an arrangement is extremely sensitive to the presence of dust particles or of discontinuities in the backing plate surface.

It has also been proposed that a frictional material, such as silicone rubber, be used to adhere the wafers to the carrier. While such a material will provide a high resistance to lateral wafer sliding, it typically will not support a wafer uniformly over its surface area and the polishing removal rates are correspondingly nonuniform across the wafer surface. This will cause the finished polished surface to be uneven and display waves (variations in polished surface flatness over significant distances) or crowning.

SUMMARY OF THE INVENTION

The present invention provides means for adhering wafers to a backing plate of a polishing machine which not only assures that the front side surface of a wafer can be polished flat irrespective of asperities on the back side or surface of the wafer or in its thickness, but also provides securance of the wafer during the polishing operation in a liquid-free manner. Basically, the invention is a sheet of a wafer mounting material on the backing plate providing a combination of properties. It has a flat exposed surface adherable directly to the back surface of a wafer with a bond having sufficiently high static resistance to shear forces to prevent slippage during the polishing operation. Such sheet of material also is volume compressible to absorb upon application of a polishing pressure which is applied uniformly over the wafer surface area, and without deforming the wafer, any asperities on the wafer back side or in its thickness.

Most desirably, the sheet of wafer mounting material of the invention is a laminate composite which includes as a lamina providing the wafer adherence surface, a polymeric material which exhibits surface wetting characteristics which aid in such wafer adherence. The surface of the polymeric lamina is also most desirably elastic and possesses sufficient tensile strength to enable it to readily conform to the back side of an individual wafer and yet be suitable for repeated use.

The volume compressibility of the mounting material is preferably provided by another lamina which is volume compressible (compressible with a corresponding compression of its volume) in response to a uniformly applied pressure, over a compression range required to absorb the wafer back side asperities and any small particulate matter which might be between the wafer and the adherence surface of such material, i.e., it should be capable of compressing at least about one mil in response to a single pressure without expansion in other directions. The volume compressible lamina is also most desirably elastic and possesses a relatively high tensile strength to enable it to be suitable for repeated use. It has been found that a volume compressible lamina of two layers of material, one of which is a poromeric material and the other of which is a fibrous material, provides especially good results, when the poromeric layer is the one of the two layers directly secured to the lamina of polymeric material. While it is not entirely understood why such a two layer volume compressible lamina is so effective, it is believed to be that the poromeric material will absorb the wafer asperities without reducing the support the material provides for those portions of the wafer immediately adjacent such asperities, whereas the fibrous volume compressible material completely absorbs the deformation of the poromeric material caused by the asperities and prevents the hard surface of the backing plate from affecting the same.

BRIEF DESCRIPTION OF THE DRAWING

With reference to the accompanying single sheet of drawing.

DETAILED DESCRIPTION OF A PREFERRED EMBODIMENT

Figure 1:
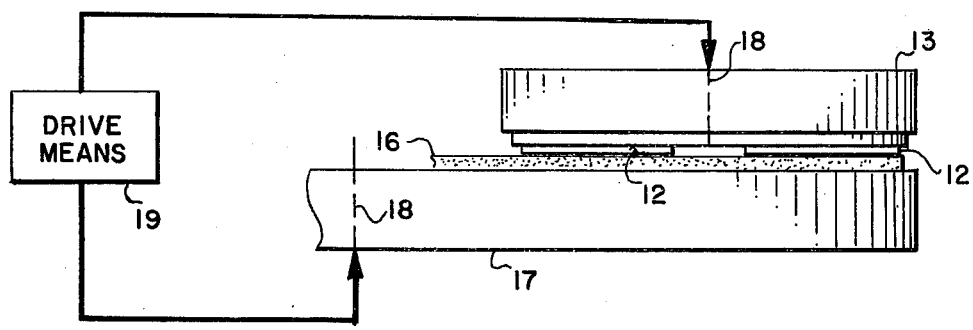
FIG. 1 is a partial schematic elevation view of a semiconductor wafer polishing apparatus incorporating a preferred embodiment of the invention.
Figure 2:
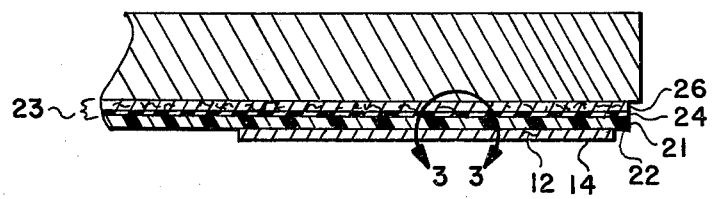
FIG. 2 is an enlarged partial schematic view illustrating in more detail the construction of a preferred wafer mounting material of the invention.
Figure 3:
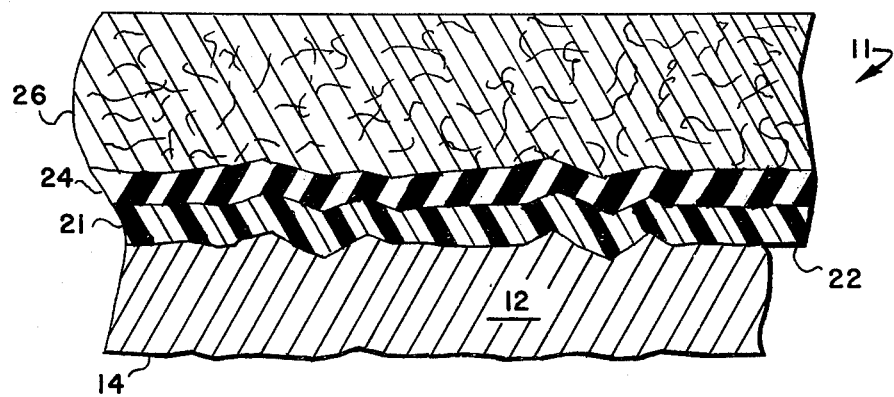
FIG. 3 is an enlarged partial sectional view of that portion of the construction of FIG. 2 encircled by the lines 3—3, illustrating the manner in which the mounting material of the invention absorbs asperities in the back side of a wafer.

With reference to FIGS. 1-3, a preferred mounting material of the invention, generally referred to by the reference numeral 11, is illustrated adhering a plurality of thin circular discs or, in other words, wafers 12 to a backing plate or carrier 13 with a front surface 14 of each of such wafers exposed. Typically such wafers are of crystalline silicon material and are two, three or sometimes four inches (5.1, 7.6, and 10.2 cm) in diameter and 0.015 to 0.025 inches (0.38 to 0.64 mm) thick. As mentioned previously, such wafers are formed by slicing thinly a single crystal of silicon which is in cylindrical form. Each of the resulting wafers will therefore have two generally flat surfaces which are formed by the sawing operation. Such surfaces will have saw marks or other irregularities in the same. In this connection, the term "asperities" as used herein is meant to include saw marks, dimples, waves or any unevenness in a surface which prevents the same from being absolutely flat.

As illustrated, each wafer front surface is engaged by a polishing pad 16 mounted on a platen 17. In accordance with conventional practice, platen 17 and carrier 13 are rotatable relative to one another about their respective axes 18 by a drive mechanism schematically indicated at 19. Carrier 13 and platen 17 engage the polishing pad 16 against the front surface 14 of the wafers with a polishing pressure, e.g., 10 to 15 pounds per square inch (7 to 10.5 grams per mm$^2$). A typical polishing pad for material removal polishing is that sold by the Rodel Corporation, Newark, Del., with the designation "SubolV", which polishing pad is made of polyurethane.

A polishing liquid is generally applied to the interface between the polishing pad and the wafer front surfaces. Such polishing liquid typically is a slurry of colloidal silica particles in a size range of, for example, 30-50 millimicrons, suspended within a mixture of water and sodium hydroxide.

On relative rotation of the carrier 13 and platen 17, the front surfaces of the wafers will be polished. The rate of removal of material from the wafer's surface depends upon the condition and type of polishing pad, the applied polishing pressures, and the speeds of rotation. Generally, such removal rate varies between about 0.5 and 1.5 microns per minute of material. The polishing which is effected is believed to be due not only to abrasive removal of material but also to a surface chemical reaction because of the presence of the slurry.

Most polishing apparatuses now in use have a plurality of carriers to which wafers 11 are secured for engagement with a polishing pad. Typically, the carriers are removable from the polishing apparatus to enable the wafers to be mounted thereon. The Model 320A-14 Wafer Polishing Machine available from Siltec Corporation, Menlo Park, Calif., is one for which the invention is ideally suited. Such machine has four aluminum carriers, each of which has a diameter of 14 inches (36 cm), providing the machine with a total capacity of over fifty 3-inch (7.6 cm) diameter wafers.

As mentioned previously, wafers historically have been secured to the carrier for the polishing operation by a wax-based film. Recent criteria on the quality of the finished wafer surface, however, generally cannot be met with the use of such a wax-based film. In this connection, asperities on the back surface of the wafer and dust particles between the wafer and carrier, will be "telegraphed" through the wafer and impair the flatness of the polished surface. Moreover, it is important for many applications that both the front and back surfaces of wafers be entirely free from foreign material of any kind. The use of wax and subsequent cleaning solvents makes it very difficult to assure consistently clean and stain-free wafer surfaces.

As a result of these difficulties, various wax-free mounting systems have been devised. One of such methods relies on a template made of MYLAR ® or a similar material to support wafers around their periphery. Another method utilized is vacuum retention, i.e., the wafers are maintained against the carrier surface by the application of suction to the wafer back surfaces. While both of these approaches largely eliminate the cleaning problems associated with wax-based film wafer retention, neither effectively prevents asperities in the back side of the wafers from affecting the finished polished surfaces. And while some adhesive elastomers, such as silicone rubber, have been used, such materials are essentially incompressible and under the influence of polishing forces tend to flow to the wafer periphery. The result is that the wafer is not supported uniformly and the polishing removal rates are likewise non-uniform across the wafer's surface irrespective of asperities on the front surface of the wafer which are to be removed.

The present invention provides wax-free mounting of wafers on a carrier in a manner which assures that the quality of the finished wafer surface will not be affected by asperities on the back surface of the wafer or dust particles between the wafer and the carrier. It comprises a wafer mounting material which is interposed between the normal carrier mounting surface and the wafers. Most desirably, the wafer mounting material is a laminate composite made up of two laminae individually providing wafer adherence and volumetric compression to absorb any asperities on the back surface of the wafer or in its thickness.

The preferred laminate composite of the invention is illustrated in more detail in FIGS. 2-3. As shown therein, material 11 includes an outermost lamina 21 providing a flat exposed surface 22 which adheres directly to the back side surface of the wafers. In order to assure that the surface 22 will readily conform to the back side of an individual wafer irrespective of asperities therein, it should be both elastic and soft. For example, for silicon wafers having asperities in their back surface extending as much as one mil beyond the nominal wafer surface, the material of lamina 21 should have a hardness between about 10-100 Shore A as measured by ASTM Method D 785. Lamina 21 is also most desirably impermeable to the polishing slurry, in order to prevent such slurry from attacking the underlying lamina 23 of volume compressible material which will be described below.

The thickness of lamina 21 can vary considerably. It is only necessary that the material be sufficiently thick to retain its structural integrity and exhibit the surface characteristics. The upper limit on its thickness is defined by its ability to retain flexibility and not resist deformation by the asperities in the back surface of the wafer. Different materials having thicknesses in the range of between about 5 and 50 mils have been used successfully.

Insofar as the adhesion between the material and the wafers are concerned, most desirably the material is one of the polymeric materials which not only has a relatively high coefficient of friction, but will also exhibit surface wetting characteristics with the material of the wafer. That is, the polymeric material is a solid having a free surface energy so related to the free surface energy of the wafer material that an intimate cohesive bond is achieved at the interface between the polymeric material and the wafer, without the polymeric material losing its structural integrity on the macroscopic level. The adhesion of the wafer to the surface of the polymeric material must provide sufficiently high static resistance to shear forces to prevent slippage of the wafer on the material during polishing. The degree of adhesion required will depend on the lateral forces to which it is expected the wafer will be subjected by the passage of the polishing pad laterally across the wafer surface. For example, the lateral force exerted by the model 320A-14 polishing machine mentioned earlier on a three inch wafer when it is used with a new Rodel polishing pad and a polishing pressure of 10 p.s.i. (7 gms/mm$^2$) is in the order of 20 pounds (9 kg). As a practical matter, the upper limit on shear forces exerted on three inch wafers by polishing machines now on the market is about 200 pounds (90 kg). The adhesion to the back side of the wafer should be relatively complete over its full surface area in order to prevent migration of polishing slurry and other contaminants beneath the wafer.

The surface adhesion provided by the surface 22 of layer 21 preferably is one which varies with temperature or other ambient conditions. Proper selection of such a material will enable the wafers to be adequately adhered to the material during the polishing operation but yet, by cooling or temperature elevation, enable the bond between the wafer and the material to be relatively easily broken. The surface of the material is also most desirably resilient to enable it to be used repeatedly. That is, the depression and asperities left in the material due to one wafer most desirably do not remain in the material to affect the adhesion to later applied wafers. Moreover, the surface characteristics of the material responsible for the wafer bond should also be retained to enable repeated usage.

There are very many polymeric material formulations which will exhibit the surface wetting characteristics discussed above that are suitable for use with the instant invention. As known in the plastics art, the surface adhesion may be characteristic of the one or more primary polymers making up a formulation, or be characteristic of plasticizers, tackifiers or other additive materials. The selection of a material for a particular application will depend not only on the factors discussed above, but cost, availability, etc. Polymers which are suitable include flexibilized polyvinyl chloride; ethylene ethyl acrylate; ethylene vinyl acetate; styrene ethylene; styrene butylene; vinyl chloride-acetate; the aliphatic polyamides; and low molecular weight polyethylene and urethanes. One material which has been found especially effective to rigidly hold the wafers and yet enable any asperities to be telegraphed therethrough to the underlying volume compressible material is an eight mil (0.02 mm) thick layer of flexibilized polyvinyl chloride identified as "Trans Flex O Cast" and sold by Transilwrap Corporation of Minneapolis, Minn. Other materials which have been used satisfactorily include a 20 mil (0.05 mm) thick layer of the flexible vinyl sold under the designation DPC-35 by Almac Plastics, Long Island, N.Y.; and a 19 mil (0.05 mm) thick layer of the "high tack film" sold under the designation KGML8G by Kohkokii U.S.A. Inc., Everitt, Wash.

The lamina 23 of volume compressible material in this preferred embodiment is actually made up of two layers; layer 24 of a relatively thin poromeric material which is adhered to the lamina 21, and a significantly thicker layer 26 of a fibrous material. Wafer adherence lamina 21 is secured to the layer 24 by any suitable flexible adhesive which will not deleteriously affect the transmission of asperities between the lamina 21 and the lamina 23. Of course, the adhesive should be capable of resisting the shear forces to which the interface between the laminae will be subjected during the polishing operation. Moreover, it will be selected to be resistant to the polishing slurry. An adhesive which has been found quite suitable is that contained on the No. 467 adhesive transfer tape sold by Minnesota Mining and Manufacturing Co. of St. Paul, Minn. It has been found that the dual stage absorption of asperities provided by the combination of a poromeric layer with a more compressible layer of another volume compressible material, provides effective asperity absorption without reducing the firmness of the wafer support necessary to achieve uniform material removal at efficient rates. The greater compressibility of the other material layer can be advantageously provided by making such a layer significantly thicker than the layer of poromeric material.

Although the phenomenon responsible for the effectiveness of the double-layer volume compressible material is not entirely understood, it is believed that the poromeric material absorbs the asperities without affecting the amount of wafer support provided immediately adjacent such asperities, while the more compressible fibrous layer assures that the deformation of the poromeric material caused by asperities is completely absorbed and not transmitted to the hard surface of the backing plate.

While the volume compressible material of layer 26 in this preferred embodiment is a fibrous material because, as will be seen from the following, poromeric materials laminated to fibrous materials are readily available, any volume compressible material which can be significantly compressed at the polishing pressures, e.g., compressed 2 to 10 mils when subjected to 10 p.s.i. (7 kg/cm$^2$) will suffice.

From the general standpoint, the volume compressible material, or layers of material, making up lamina 23 can be any which will compress for the depth of the expected asperities without significantly more pressure than that which is applied to the wafers during the polishing operation. That is, the resistance of the volume compressible material to the additional compression which is necessary to absorb the asperities in the back surface of the wafer should be essentially the same as its resistance to the pressure which is uniformly applied against the wafer surface by the polishing pad. The result is that the asperities will be absorbed by the material without exerting any more resistance to the polishing pressure than is otherwise exerted by the volume compressible material. As a practical matter, it has been found that most materials that compress by about 1.5 to 10 mils at the polishing pressure readily absorb the much small asperities present on a wafer back side or in the form of particulates between the wafer and the lamina 21 providing the adherence surface. It is preferred that the degree of compression be at the lower end of the range, i.e., 2-3 mils (5-7.6 mm), in order to provide the desired firm support for the wafers for polishing efficiency while still enabling back side asperities, etc., to be effectively absorbed.

Some poromeric materials are sold with a fibrous or felt-like backing, thereby providing both the layer 24 and the layer 26. One quite suitable material which is readily available is the polyurethane polishing pad material sold as a "Corfam" substitute by the George Newman Company of Beverly, Mass. Such material has about a 12 mil thick poromeric layer and a fibrous backing which is about 28 mils thick. The composite compresses approximately 2.5 mils when subjected to 10 p.s.i. pressure, a typical polishing pressure. When such material is laminated to an 8 mil thick lamina of Trans Flex O Cast polyurethane as identified previously, the total composite of volume compressible material will be compressed approximately 2.2-2.3 mils when subjected to a polishing pressure of about 10 p.s.i.

As will be recognized from the above, the degree of compression of the material will be dependent on the compressibility of not only the layers 24 and 26 but also on the compressibility of lamina 21. A compressive modulus for the composite laminate of between about 50 and 300 lbs/sq. in. provides a generally satisfactory absorption of asperities and yet enables efficient polishing when a polishing pressure of between about 10 and 15 lbs/sq. in. (0.7 and 10.5 km/cm$^2$) is used.

EXAMPLES

In one trial run, the wafer mounting material was a composite laminate of eight mil thick flexibilized polyvinyl chloride (TRANS FLEX O CAST) adhesively laminated with the adhesive from the previously mentioned transfer tape to a lamina of the polishing pad material also mentioned previously available from the George Newman Co. The sheet of such wafer mounting material was cut to fit a 14 inch (35.5 cm) carrier of the previously identified Model 320A-14 polishing machine. The backing plate for the machine was made of aluminum and the mounting material was also adhered thereto by the adhesive on the previously mentioned transfer tape. Fourteen silicon wafers having a 3-inch (7.6 cm) diameter were positioned in an equally spaced apart pattern on the exposed surface of the mounting material. Such wafers had, on the average, back surface asperities of about 0.2 mils.

The assembly of wafers on the backing plate was placed in a heat press station where it was heated to a temperature of 125° F. (52° C.) for a period of one minute while the wafers were being pressed into the mounting material with a pressure of about 1 p.s.i. (70 grams/cm$^2$). The heated press platen which contacted the wafer front surfaces was covered with a resilient cushion layer to prevent wafer damage and provide a more uniform distribution of the press force.

The backing plate carrying the wafers was then mounted on the polishing machine and conventional wafer polishing procedures were followed, including the use of a final finishing step. The conditions during polishing were as follows:
Ambient temperature, ° C.: 21
Pad temperature, ° C.: 55
Input cooling water temperature, ° C.: 20
Pad Type: Clarino (new)
Slurry rate (cc/min): 400
Slurry Ph: 10.6 ± 0.1
Head pressure: 0.7 kg/cm$^2$ The material was removed from the front surfaces of the wafers at a rate of about 0.7 microns per minute. After polishing for about twenty minutes, followed by a final finishing polishing with a softer pad for about 1 minute, the carrier was removed from the polishing machine and the wafers separated from the carrier. For such separation, the wafers and mounting material were chilled to about 2° C. by being subjected to a stream of water at such temperature for approximately one minute. A thin-bladed tool was then inserted underneath each individual wafer to break the bond.

The flatness of the wafers was then measured by means of an ADE electronic thickness measuring instrument. It was found that the non-linear thickness variation of the front surface of the wafers did not vary more than 0.1 mil.

Although the invention has been described in connection with a preferred embodiment thereof in accordance with the dictates of the patent statutes, it will be recognized that various changes and modifications can be made to it without departing from its spirit. It is therefore intended that the coverage afforded applicant be defined only by the scope of the invention as set forth in the claims or their equivalent language.

I claim:

1. In polishing apparatus having a backing plate on which a thin generally flat wafer is to be mounted with a first side surface thereof exposed to be polished, a polishing pad to engage said first side surface of said wafer with a polishing pressure applied essentially uniformly over the area of said surface, and drive means to cause relative lateral motion between said polishing pad and said first side surface to polish the latter; the improvement to the combination comprising a sheet of a wafer mounting material on said backing plate having a generally flat exposed surface provided by an impervious polymeric material exhibiting direct solid-to-solid wetting characteristics at said exposed surface with the material of said wafer to provide an intimate dry cohesive bond at the interface of a second side surface of a wafer and said polymeric material resistant to tensile separation forces and having sufficiently high static resistance to shear forces to prevent slippage of said wafer on said polymeric material from being caused by the passage of said polishing pad laterally across said wafer first side surface during polishing thereof, said sheet of wafer mounting material being volume compressible to absorb without deforming said wafer any asperities at said second side of said wafer or in the thickness thereof upon said uniform application of polishing pressure.

2. A polishing apparatus according to claim 1 wherein said bond provided by said wafer mounting material is repeatable and said volume compressiblity thereof is elastic, whereby said material is reusable for successive wafers to be polished.

3. A polishing apparatus according to claim 1 wherein said polymeric material has a thickness in the range of between about 5 and 50 mils.

4. A polishing apparatus according to claim 1 wherein said polymeric material has a hardness between about 10 and 100 Shore A as measured by ASTM Method D 785.

5. A polishing apparatus according to claim 1 wherein the volume compressibility of said sheet of mounting material is generally provided by a lamina of material adhesively secured to a lamina of polymeric material providing said exposed surface.

6. A polishing apparatus according to claim 5 wherein the resistance of said volume compressible material to the additional compression necessary to absorb said asperities is essentially the same as the resistance provided thereby to compression upon application of said polishing pressure.

7. A polishing apparatus according to claim 6 wherein said volume compressible material is selected to compress between about 1.5 and 10 mils when subjected to said polishing pressure.

8. In polishing apparatus having a backing plate on which a thin flat wafer is to be mounted with a front side surface thereof exposed to be polished, a polishing pad to engage said front side surface of said wafer with a polishing pressure applied essentially uniformly over the area of said surface, and drive means to cause relative lateral motion between said polishing pad and said surface to polish the latter; the improvement to the combination comprising a sheet of a wafer mounting material on said backing plate having a flat exposed surface provided by a solid lamina of a polymeric material exhibiting wetting characteristics at said surface with the material of said wafer to aid in adherence of the back side surface of a wafer intimately engaged therewith to said backing plate with a bond having sufficiently high static resistance to shear forces to prevent slippage of said wafer on said material from being caused by the passage of said polishing pad laterally across said wafer surface during polishing thereof, said sheet of material including a second lamina of material adhesively secured to said lamina of polymeric material which is volume compressible to absorb without deforming said wafer any asperities on the back side of said wafer or in the thickness thereof upon said uniform application of polishing pressure, said lamina of volume compressible material including a layer of a poromeric material and a more compressible layer of another volume compressible material.

9. In polishing apparatus having a backing plate on which a thin generally flat wafer is to be mounted with a first side surface thereof exposed to be polished, a polishing pad to engage said first side surface of said wafer with a polishing pressure applied essentially uniformly over the area of said surface, and drive means to cause relative lateral motion between said polishing pad and said first side surface to polish the latter; the improvement to the combination comprising a sheet of a wafer mounting material on said backing plate having a generally flat exposed surface provided by a polymeric material exhibiting direct solid-to-solid wetting characteristics at said surface with the material of said wafer to provide an intimate dry cohesive bond at the interface of a second side surface of a wafer and said polymeric material resistant to tensile separation forces and having sufficiently high static resistance to shear forces to prevent slippage of said wafer on said polymeric material from being caused by the passage of said polishing pad laterally across said wafer first side surface during polishing thereof, said sheet of wafer mounting material being volume compressible to absorb without deforming said wafer any asperities at said second side of said wafer or in the thickness thereof upon said uniform application of polishing pressure; and said polymeric material being selected from the group consisting of flexibilized polyvinyl chloride; ethylene ethyl acrylate; ethylene vinyl acetate; styrene ethylene; styrene butylene; vinyl chloride-acetate; the aliphatic polyamides; polyethylene; and urethanes.

10. In polishing apparatus having a backing plate on which a thin generally flat wafer is to be mounted with a first side surface thereof exposed to be polished, a polishing pad to engage said first side surface of said wafer with polishing pressure applied essentially uniformly over the area of said first side surface, and drive means to cause relative lateral motion between said polishing pad and said first side surface to polish the latter; the improvement to the combination comprising a sheet of a wafer mounting material on said backing plate having a generally flat exposed surface provided by a solid impervious polymeric material that exhibits solid-to-solid wetting characteristics with the material of said wafer to provide an intimate dry cohesive bond at the interface of a second side surface of a wafer and said polymeric material resistant to tensile separation forces and having sufficiently high static resistance to shear forces to prevent slippage of said wafer on said polymeric material from being caused by the passage of said polishing pad laterally across said wafer first side surface during polishing thereof.

11. In polishing apparatus having a backing plate on which a thin generally flat wafer is to be mounted with a first side surface thereof exposed to be polished, a polishing pad to engage said first side surface of said wafer with a polishing pressure applied essentially uniformly over the area of said surface, and drive means to cause relative lateral motion between said polishing pad and said first side surface to polish the latter; the improvement to the combination comprising a sheet of a wafer mounting material on said backing plate having a generally flat exposed surface provided by flexibilized polyvinyl chloride exhibiting direct solid-to-solid wetting characteristics at said exposed surface with the material of said wafer to provide an intimate dry cohesive bond at the interface of a second side surface of a wafer and said polyvinyl chloride, which bond is resistant to tensile separation forces and has a sufficiently high static resistance to shear forces to prevent slippage of said wafer on said exposed surface from being caused by the passage of said polishing pad laterally across said wafer first side surface during polishing thereof, said sheet of wafer mounting material being volume compressible to absorb without deforming said wafer any asperities at said second side of said wafer or in the thickness thereof upon said uniform application of polishing pressure.

12. In polishing apparatus having a backing plate on which a thin generally flat wafer is to be mounted with a first side surface thereof exposed to be polished, a polishing pad to engage said first side surface of said wafer with polishing pressure applied essentially uniformly over the area of said first side surface, and drive means to cause relative lateral motion between said polishing pad and said first side surface to polish the latter; the improvement to the combination comprising a sheet of a wafer mounting material on said backing plate having a generally flat exposed surface provided by a solid polymeric material that exhibits solid-to-solid wetting characteristics with the material of said wafer to provide an intimate dry cohesive bond at the interface of a second side surface of a wafer and said polymeric material, which bond is resistant to tensile separation forces and has a sufficiently high static resistance to shear forces to prevent slippage of said wafer on said polymeric material from being caused by the passage of said polishing pad laterally across said wafer surface during polishing thereof, and said polymeric material being selected from the group consisting of flexibilized polyvinyl chloride; ethylene ethyl acrylate; ethylene vinyl acetate; styrene ethylene; styrene butylene; vinyl chloride-acetate; the aliphatic polyamides; polyethylene; and urethanes.

13. In polishing apparatus having a backing plate on which a thin generally flat wafer is to be mounted with a first side surface thereof exposed to be polished, a polishing pad to engage said first side surface of said wafer with polishing pressure applied essentially uniformly over the area of said first side surface, and drive means to cause relative lateral motion between said polishing pad and said first side surface to polish the latter; the improvement of the combination comprising a sheet of a wafer mounting material on said backing plate having a flat exposed surface provided by a flexibilized polyvinyl chloride that exhibits solid-to-solid wetting characteristics with the material of the wafer to provide an intimate dry cohesive bond at the interface of a second side surface of a wafer and said polyvinyl chloride, which bond is resistant to tensile separation forces and has a sufficiently high static resistance to shear forces to prevent slippage of said wafer on said polymeric material from being caused by the passage of said polishing pad laterally across said wafer first side surface during polishing thereof.

* * * * *